(12) United States Patent
Hung

(10) Patent No.: US 6,830,449 B1
(45) Date of Patent: Dec. 14, 2004

(54) INJECTOR ROBOT FOR REPLACING A GAS INJECTOR IN A FURNACE

(75) Inventor: Cheng-Chung Hung, Tai-Nan (TW)

(73) Assignee: SIS Microelectronics Corporation, Hsin-Chu (TW)

( * ) Notice: Subject to any disclaimer, the term of this patent is extended or adjusted under 35 U.S.C. 154(b) by 0 days.

(21) Appl. No.: 10/770,669

(22) Filed: Feb. 2, 2004

(51) Int. Cl.[7] ............................................... F27D 3/12
(52) U.S. Cl. ...................... 432/241; 432/200; 118/729; 414/937; 414/940
(58) Field of Search ................................ 432/200, 239, 432/241, 243; 414/936, 937, 940, 941; 118/725, 728, 729; 261/64.1

(56) References Cited

U.S. PATENT DOCUMENTS

| | | | | |
|---|---|---|---|---|
| 3,836,325 A | * | 9/1974 | Nakamura et al. ........... | 432/241 |
| 5,221,201 A | * | 6/1993 | Yamaga et al. .............. | 432/241 |
| 6,390,754 B2 | * | 5/2002 | Yamaga et al. .............. | 414/217 |
| 6,435,865 B1 | * | 8/2002 | Tseng et al. ................. | 432/152 |

* cited by examiner

*Primary Examiner*—Gregory Wilson
(74) *Attorney, Agent, or Firm*—Squire, Sanders & Dempsey, L.L.P.

(57) ABSTRACT

The present invention provides an injector robot for replacing a gas injector in a running furnace, which is still running and without any cooling and reheating action. According to the present invention, the injector robot is arranged and mounted upon a boat elevator, which is originally used to transport a boat with wafers into the furnace. The replacement of the gas injector could be executed precisely and safely by the assistant means and will not affect the predetermined procedure of the furnace.

27 Claims, 5 Drawing Sheets

INJECTOR ROBOT FOR REPLACING A GAS INJECTOR IN A FURNACE

BACKGROUND OF THE INVENTION

1. Field of the Invention

The present invention relates to a mechanistic apparatus used for replacing a tubular means, and more particularly relates to an injector robot used for replacing a gas injector in a furnace.

2. Description of the Prior Art

FIG. 1 illustrates a schematic structure of a vertical furnace 100. The vertical furnace 100 is equipped with a thermal insulating cover 102 within. Within the internal area of the thermal insulating cover 102, an outer quartz tube 104, an inner quartz tube 106 and a plurality of heaters 108 are arranged to form a process tube 110 with a cylindrical space. Various reaction gases used in the process tube 110 are introduced by gas supply conduits 112 and gas injectors 116 and are finally discharged by gas exhaust conduits 114. The gas injector 116 is used to conduct the reaction gas and release it at the designate position in the process tube 110. Plurality of semiconductor substrates such as silicon wafer is housed in a quartz-made boat 120, which is mounted on a platform 118 of a boat elevator 120. Hence, during a thermal oxidation process, wafers carried by the boat 120 will be moved upward into the process tube 110 and finally moved downward from the process tube 110 by the supporting of the boat elevator 120 in the vertical furnace 100.

After a certain amount of thermal chemical processing deposition, the gas injector 116 must be dropped from the vertical furnace 100 and replaced by a new one. In a conventional gas injector replacing process, the temperature within the process tube 110 must be cooled down to about 400–500° C., then an operator that wearing heat-insulating gloves can pull out the gas injector 116 from the gas supply conduit 114. Afterward, to the contrary of the above-described operation, a new gas injector 116 with same or different specification is provided and inserted into the gas supply conduit 114, then the process tube 110 will be heated up to the normal operating temperature (ex. usually about 600° C.). But during the replacing process, an unexpected-breaking gas injector 116 will probably scald the furnace operator standing below the process tube 110. Alternatively, another method for replacing the gas injector is adopted to stop the operation of the vertical furnace 100 until the temperature, within the process tube 110, is cooled to room temperature for lowering the danger to the furnace operator. But it will take about 4–5 hours for the cooling and reheating steps and delay the predetermined program of the vertical furnace 100.

In the two above conventional gas injector replacing processes, frequently cooling and reheating processes executed in the vertical furnace 100 will chap the reactive film coated on the wall of the process tube 110, thus particle pollution will occur in the vertical furnace 100. Besides, the above manual operations for replacing the gas injectors 116 are difficult to control because the length of the gas injectors 116 always exceed over 1 meter, and the furnace operator can not guarantee that he/she could insert the gas injector 116 into the gas supply conduit 112 with a parallel and unsloping angle.

Therefore, a mechanistic assistant apparatus is proved necessary for the operator to replace the gas injector 116 in the vertical furnace 100, which is still running and without any cooling and reheating action. Then the replacement of the gas injector 116 could be executed precisely and safely by the assistant means and will not affect the predetermined procedure of the vertical furnace 100.

SUMMARY OF THE INVENTION

As above descriptions, one object of the present invention is providing an injector robot for replacing a gas injector in a furnace precisely and safely and will not delay the predetermined procedure of the furnace.

Another object of the present invention is providing an injector robot and mounting it on a boat elevator in a furnace, without spending extra money to assemble other assistant elevator. Hence, the injector robot could be moved smoothly in the vertical direction by the supporting of the boat elevator in the furnace.

According to the above objects, the present invention is providing an injector robot for replacing a gas injector in a furnace. The injector robot is composed of a base placed on the boat elevator, a slide rail arranged on the base, and a support stand mounted to the slide rail. The top of the support stand is provided with a notch structure used to hold the gas injector, and then a chuck fixed to the support stand will help to stabilize the gas injector. In addition, the slide rail is used to provide a horizontal-moving track for the support stand. Hence, by the above designs and the utilization of the boat elevator, the injector robot could execute the gas injector replacement process in the furnace, and which is still running and without any cooling and reheating action as in the conventional replacement processes.

Additional objects and advantages of this invention will be apparent from the following detailed description of a preferred embodiment thereof that proceeds with reference to the accompanying drawings.

DESCRIPTION OF THE PREFERRED EMBODIMENT

Figure 1:
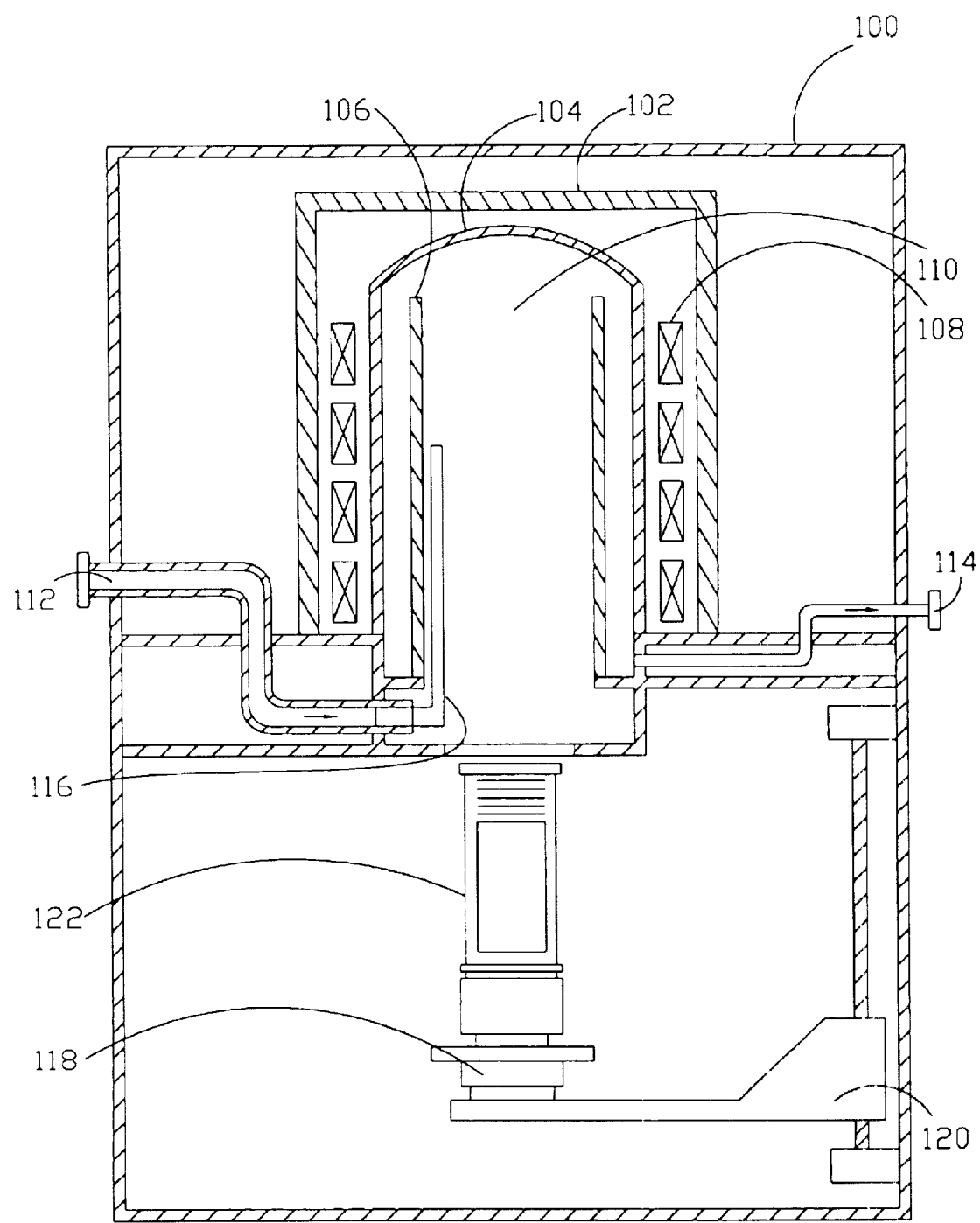
FIG. 1 illustrates a schematic structure of a vertical furnace.
Figure 2:
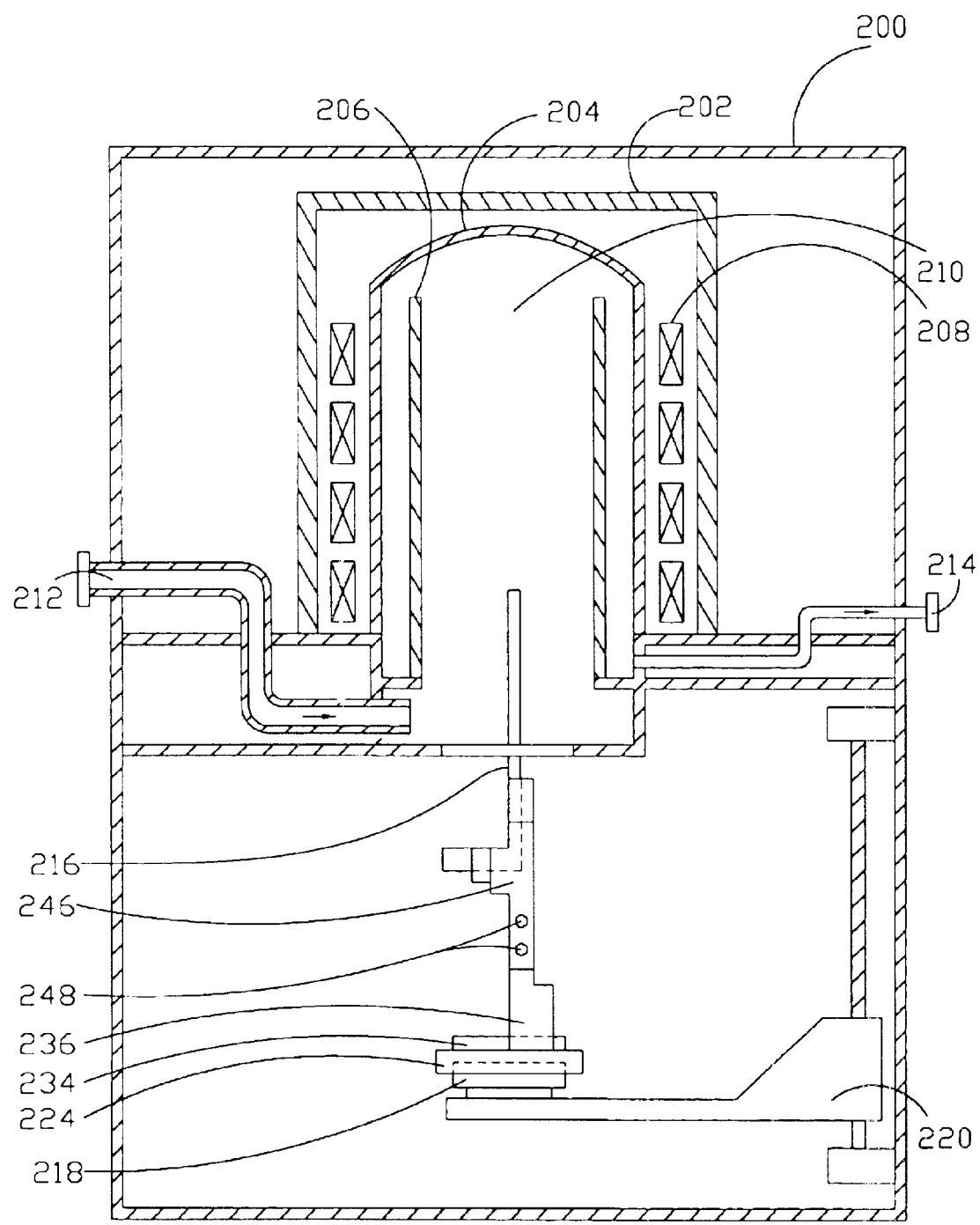
FIG. 2 illustrates a schematic structure of an injector robot arranged in a vertical furnace.

Reference is now made to FIG. 2, which is a schematic structure of an injector robot arranged in a vertical furnace 200 in accordance with one embodiment of the present invention. The vertical furnace 200 is equipped with a thermal insulating cover 202 in it. Within the internal space of the thermal insulating cover 202, an outer quartz tube 204, an inner quartz tube 206 and a plurality of heaters 208 are arranged to form a process tube 210 with a cylindrical space. Various reaction gases used in the process tube 210 are introduced by gas supply conduits 212 and gas injectors 216 and finally are discharged by gas exhaust conduits 214.

As shown in FIG. 2, the injector robot is mounted on a platform 218 of the boat elevator 220, which is used for transporting the boat in the vertical furnace 200. Hence, in this preferred embodiment, the injector robot will be able to move vertically by the assistance of the boat elevator 220.

But according to the present invention, other elevators (not shown) with the ability to transport the injector robot moving vertically could also be arranged in the present invention. The injector robot is composed of a base 224 placed on the platform 228, a slide rail 234 arranged on the base 224, and a support stand 236 mounted to the slide rail 234. The slide rail 234 is used to provide a horizontal-moving track for the support stand 236. A notch structure is provided on the upper section of the support stand 236, it is used to hold the partial section of the gas injector 216. In this embodiment, the gas injector is a L-shape structure, hence, a L-shape notch structure is provided on the upper section of the supporting stand 236 and then the corner section of the gas injector 216 will be held within the L-shape notch structure of the top section of the supporting stand 236. After the combination of the gas injector 216 and the support stand 236, a chuck 246, fixed on the supporting stand 236 with a fixing means such as hexagon bolt 248, is provided with a stabilizing baffle to prevent the gas injector 216 escaping from the support stand 236.

Figure 3A:
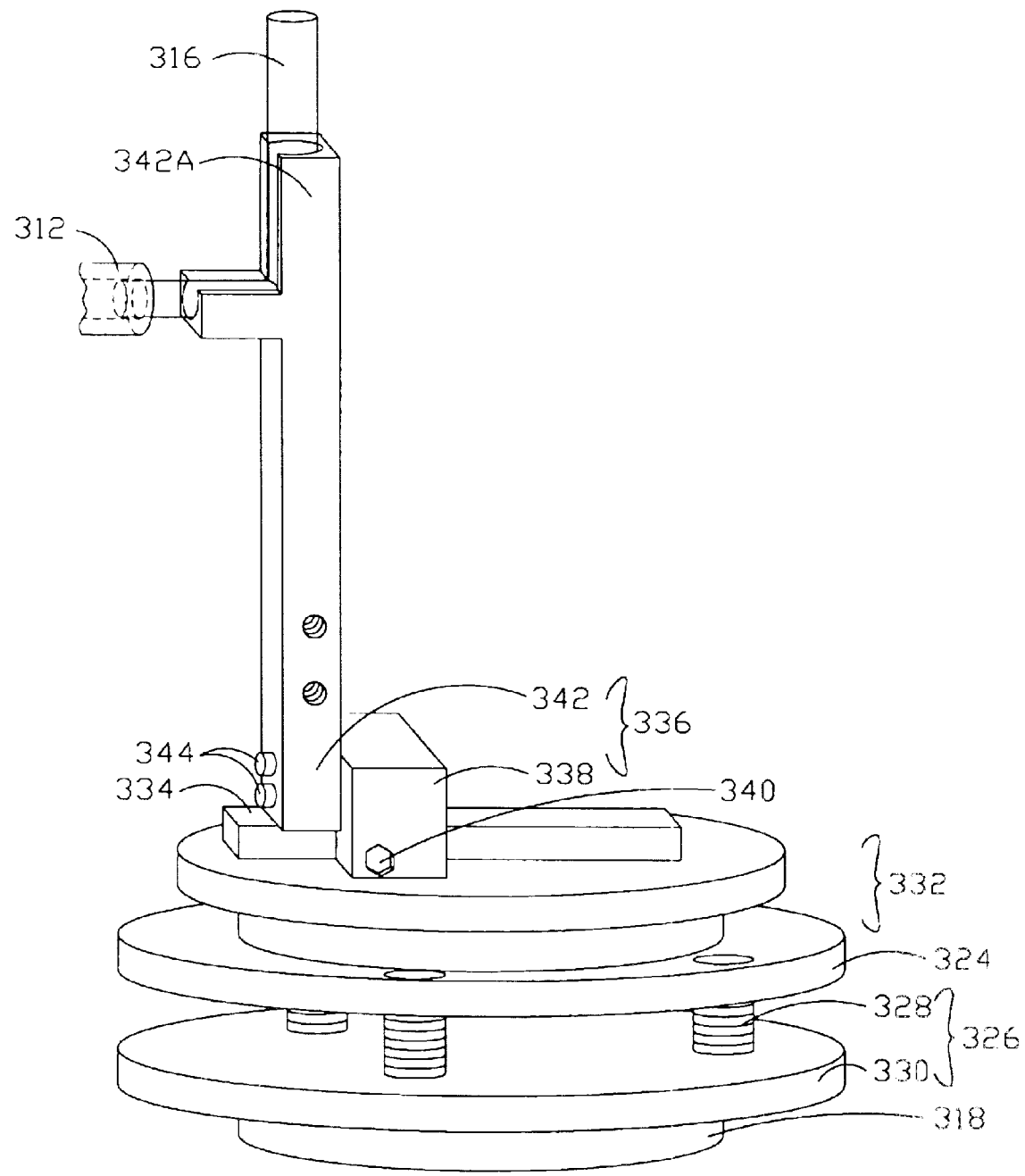
FIG. 3A and FIG. 3B illustrate the schematic solid structure of another injector robot arranged to pull out a gas injector from a gas supply.
Figure 3B:
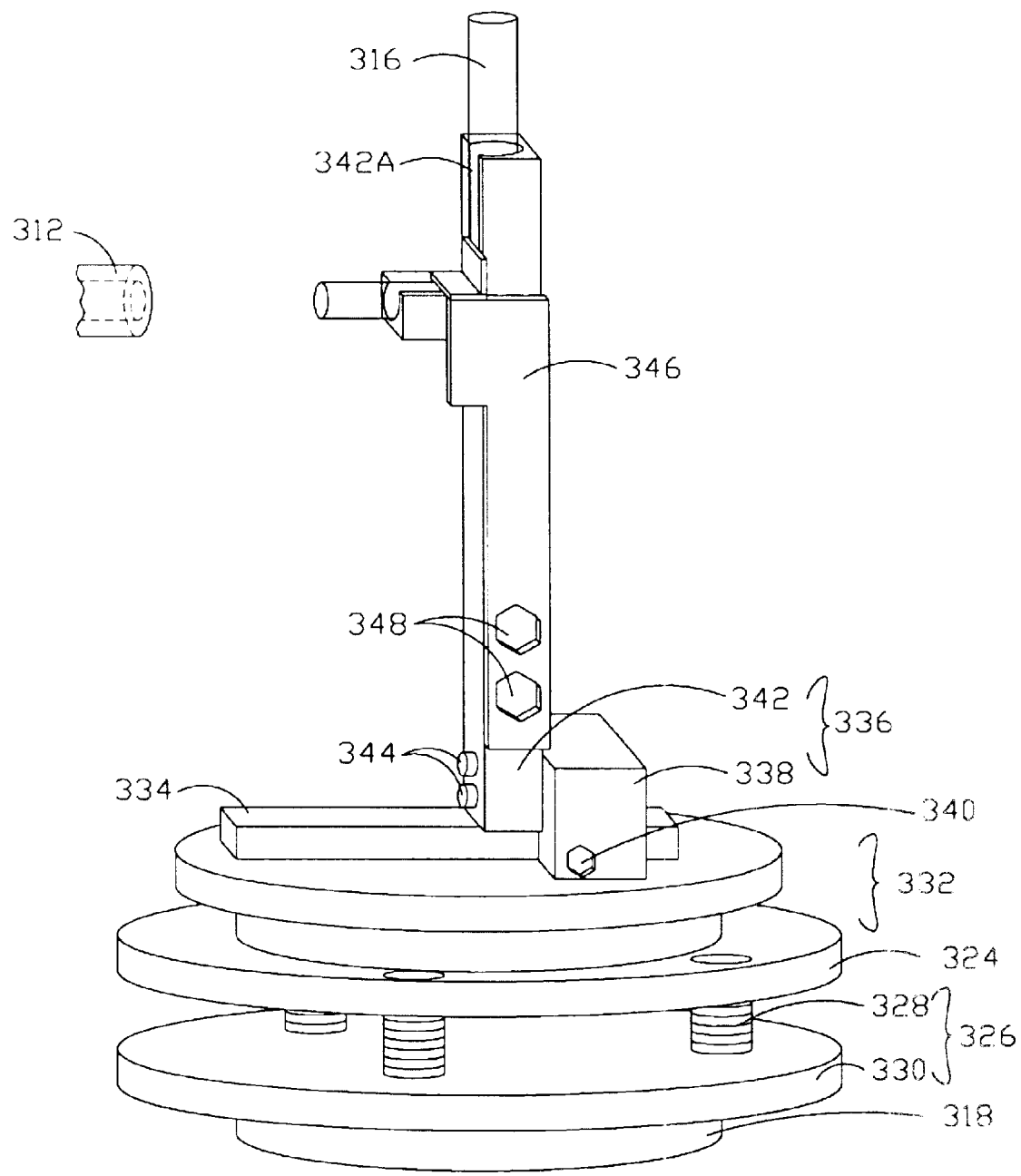

Reference is now made to FIG. 3A and FIG. 3B, which illustrate the schematic solid structure of an injector robot arranged to pull out a gas injector 316 from a gas supply conduit 312 in a furnace (not shown) in accordance with another embodiment of the present invention. First, referring to FIG. 3A, the injector robot, mounted on a platform 318 of the boat elevator (not shown), is composed of a level-adjusting means 326, a base 324, an rotary disk 332, a slide rail 334 and a support stand 336 from bottom to top. In this embodiment, the level-adjusting means 326 is used to avoid the injector robot having a sloping tendency by controlling the relative length of three adjusting screws 328, and the three adjusting screws 328 are arranged between a connection disk 330 and the base 324. But other adjusting mechanisms could also be utilized to correct the level of the injector robot according to the present invention. Besides, the connection disk 330 mounted on the platform 318, is not only arranged to make a fixed connection with the platform 318, according to the present invention, but, the connection disk 330 could be arranged to become a rotary disk by the assistance of a cylindrical-shape structure of the platform 318.

Referring to FIG. 3A, the slide rail 334 is arranged to provide a horizontal-moving track for the support stand 336, and the rotary disk 332 will be controlled to rotate the slide rail 334 toward a specific direction for pulling out the gas injector 316 from the gas supply conduits 312 in the furnace. Hence, the injector robot could execute the replacement of the gas injector 316 precisely by the cooperation of the boat elevator, the slide rail 334, the rotary disk 332 and the level-adjusting means 326. In this embodiment, the support stand 336 is composed of a support arm 342 and a support base 338. The support base 338 is mounted on the slide rail 334, and a fixing means such as hexagon bolt 340 could be used to fix the support base 338 with the slide rail 334. And the bottom of the support arm 342 is fixed with the support base 338 by another fixing means such as screws 344. Hence, by the separable design of the support base 338 and the support arm 342, the support stand 336 could be applied to various specifications of the gas injector 316 by exchanging other proper support arms 342.

Before taking the gas injector 316 apart from the gas supply conduit 312, the boat elevator is operated to transport the injector robot upward to a predetermined height and the rotary disk 332 is operated to rotate the slide rail 334 paralleling the gas supply conduit 312. Referring to FIG. 3A, the corner section of the gas injector 316 is held in the L-shape notch structure of the upper support arm 342A by a proper horizontal movement of the support base 338. However, the L-shape notch structure of the upper support arm 342A is only arranged to hold the gas injector 316 so that a chuck (not shown) provided with a stabilizing baffle is used to prevent the gas injector 316 from escaping from the notch structure of the upper support arm 342A according to the present invention.

FIG. 3B illustrates the separated situation between the gas injector 316 and the gas supply conduit 312. The gas injector 316, held by the upper support arm 342A and blocked by a horizontal baffle and a vertical baffle of a chuck 346, is pulled out horizontally from the gas supply conduit 312. The chuck 346 is fixed on the sidewall of the support arm 342 by a fixing means such as hexagon bolts 348. Afterwards, the boat elevator will be operated to transport the injector robot downward to the original height. Hence, a new gas injector could be arranged to insert into the gas supply conduit 312 in reverse order as in the above description.

In this embodiment, the L-shape notch structure of the upper support arm 342A and the horizontal and vertical baffles of the chuck 346 are arranged to stabilize the gas injector 316 in them, but other fixing mechanisms of the upper support arm 342A and the chuck 346 could also be arranged in the injector robot to fix the gas injector according to the present invention. Comparing with the circular-arc profile of the L-shape notch structure of the upper support arm 342A, FIG. 3D illustrates a solid structure of a rectangular profile of the L-shape notch structure of another upper support arm 342B. Besides, according to the present invention, the relative positions of the base 324, the level-adjusting means 326 and the rotary disk 332 are not limited as in this preferred embodiment.

Figure 3C:
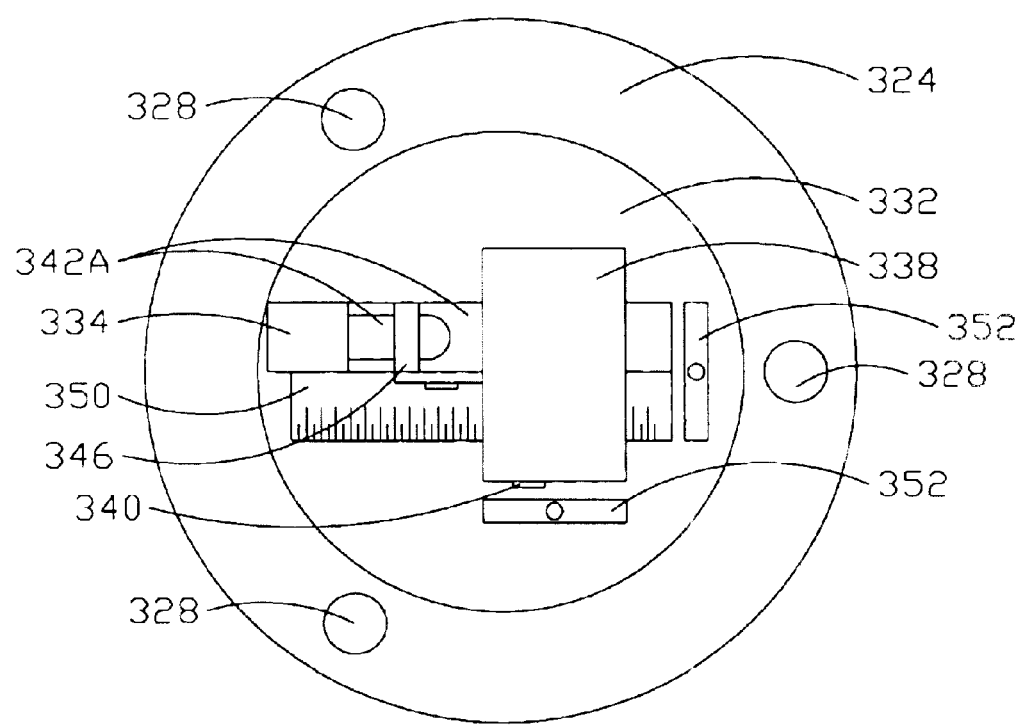
FIG. 3C illustrates a top view of another injector robot.
Figure 3D:
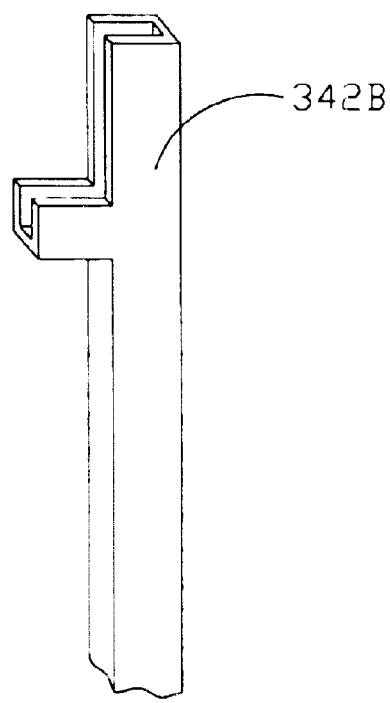
FIG. 3D illustrates a solid structure of an upper support arm.

A top view of the injector robot according to this embodiment is shown in FIG. 3C. In this embodiment, a scale 350 could be provided on the rotary disk 332 and parallel with the slide rail 334 for measuring the horizontal movement distance of the support base 338. Besides, two levels 352, one is parallel with the slide rail 334 and another is perpendicular to the slide rail 334, are also could be provided on the rotary disk 332 as a correct reference for monitoring the sloping tendency of the injector robot.

Skilled workers will further recognize that many changes may be made to the details of the above-described embodiments of this invention without departing from the underlying principles thereof. The scope of the present invention should, therefore, be determined only by the following claims.

What is claimed is:

1. An injector robot for replacing a gas injector in a furnace, comprising:
    a base;
    a slide rail arranged above said base;
    a support stand, said support stand is mounted on said slide rail, and the upper section of said support stand is provided with a notch structure for holding a partial section of a gas injector; and
    a chuck for fixing said partial section of said gas injector in the upper section of said support stand.

2. The injector robot according to claim 1, further comprising a rotary disk placed between said slide rail and said base, and said slide rail is placed on said rotary disk.

3. The injector robot according to claim 2, further comprising a level-adjusting means placed below said base.

4. The injector robot according to claim 3, wherein said level-adjusting means is composed of a adjusting screw and a connection disk and said adjusting screw is placed between said base and said connection disk, and a level is placed on said rotary disk as a correct reference for said level-adjusting means.

5. The injector robot according to claim 4, wherein the bottom of said connection disk is mounted on an elevator.

6. The injector robot according to claim 2, wherein the bottom of said base is mounted on an elevator.

7. The injector robot according to claim 3, wherein the bottom of said level-adjusting means is mounted on an elevator.

8. The injector robot according to claim 1, further comprising a rotary disk placed below said base.

9. The injector robot according to claim 8, further comprising a level-adjusting means placed below said rotary disk.

10. The injector robot according to claim 9, wherein said level-adjusting means is composed of a adjusting screw and a connection disk and said adjusting screw is placed between said rotary disk and said connection disk, and a level is placed on said base as a correct reference for said level-adjusting means.

11. The injector robot according to claim 10, wherein the bottom of said connection disk is mounted on an elevator.

12. The injector robot according to claim 9, wherein the bottom of said level-adjusting means is mounted on an elevator.

13. The injector robot according to claim 8, wherein the bottom of said rotary disk is mounted on an elevator.

14. The injector robot according to claim 1, further comprising a level-adjusting means placed below said base.

15. The injector robot according to claim 14, wherein said level-adjusting means is composed of a adjusting screw and a connection disk and said adjusting screw is placed between said base and said connection disk, and a level is placed on said base as a correct reference for said level-adjusting means.

16. The injector robot according to claim 15, wherein the bottom of said connection disk is mounted on an elevator.

17. The injector robot according to claim 14, wherein the bottom of said level-adjusting means is mounted on an elevator.

18. The injector robot according to claim 1, wherein the bottom of said base is mounted on an elevator.

19. An injector robot for replacing a gas injector in a furnace, comprising:
a boat elevator
a base mounted on a platform of said boat elevator;
a slide rail arranged above said base;
a support base mounted on said slide rail;
a support arm, wherein the bottom of said support arm is fixed with said support base and the upper section of said support arm is provided with a notch structure for holding a partial section of a gas injector; and
a chuck for fixing said partial section of said gas injector in the upper section of said support arm.

20. The injector robot according to claim 19, further comprising a rotary disk placed between said slide rail and said base, and said slide rail is placed on said rotary disk.

21. The injector robot according to claim 20, further comprising a level-adjusting means placed between said base and said platform.

22. The injector robot according to claim 21, wherein said level-adjusting means is composed of a adjusting screw and a connection disk and said adjusting screw is placed between said base and said connection disk, and the bottom of said connection disk is mounted on said platform, and a level is placed on said rotary disk as a correct reference for said level-adjusting means.

23. The injector robot according to claim 19, further comprising a rotary disk placed between said base and said platform.

24. The injector robot according to claim 23, further comprising a level-adjusting means placed between said rotary disk and said platform.

25. The injector robot according to claim 24, wherein said level-adjusting means is composed of a adjusting screw and a connection disk and said adjusting screw is placed between said rotary disk and said connection disk, and the bottom of said connection disk is mounted on said platform, and a level is placed on said base as a correct reference for said level-adjusting means.

26. The injector robot according to claim 19, further comprising a level-adjusting means placed between said base and said platform.

27. The injector robot according to claim 26, wherein said level-adjusting means is composed of a adjusting screw and a connection disk and said adjusting screw is placed between said base and said connection disk, and the bottom of said connection disk is mounted on said platform, and a level is placed on said base as a correct reference for said level-adjusting means.

* * * * *